United States Patent
Rogers et al.

(10) Patent No.: US 9,054,038 B2
(45) Date of Patent: Jun. 9, 2015

(54) FLOATING GATES AND METHODS OF FORMATION

(75) Inventors: Matthew Scott Rogers, Mountain View, CA (US); Po-Ta Chen, Mountain View, CA (US); Jing Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 179 days.

(21) Appl. No.: 13/193,573

(22) Filed: Jul. 28, 2011

(65) Prior Publication Data

US 2012/0187467 A1      Jul. 26, 2012

Related U.S. Application Data

(60) Provisional application No. 61/436,144, filed on Jan. 25, 2011.

(51) Int. Cl.

| | |
|---|---|
| *H01L 21/336* | (2006.01) |
| *H01L 21/28* | (2006.01) |
| *H01L 21/311* | (2006.01) |
| *H01L 21/321* | (2006.01) |
| *H01L 21/3213* | (2006.01) |
| *H01L 27/115* | (2006.01) |
| *H01L 29/423* | (2006.01) |

(52) U.S. Cl.
CPC .... *H01L 21/28273* (2013.01); *H01L 21/31116* (2013.01); *H01L 21/32105* (2013.01); *H01L 21/3211* (2013.01); *H01L 21/32137* (2013.01); *H01L 27/11521* (2013.01); *H01L 29/42324* (2013.01)

(58) Field of Classification Search
CPC ............ H01L 21/28202; H01L 27/115; H01L 27/11521; H01L 21/28273; H01L 21/76224
USPC .................................. 438/443, 265, 775, 264
See application file for complete search history.

(56) References Cited

U.S. PATENT DOCUMENTS

| | | | |
|---|---|---|---|
| 5,869,858 A * | 2/1999 | Ozawa et al. | 257/296 |
| 7,291,568 B2 | 11/2007 | Burnham et al. | |
| 7,585,730 B1 * | 9/2009 | Song et al. | 438/264 |
| 2005/0087822 A1 | 4/2005 | Khare et al. | |

(Continued)

FOREIGN PATENT DOCUMENTS

| KR | 20040101927 A | 12/2004 |
|---|---|---|
| KR | 20080067442 A | 7/2008 |

OTHER PUBLICATIONS

International Search Report and Written Opinion Dated Mar. 14, 2012 for International Application No. PCT/US2011/045635.

*Primary Examiner* — Kenneth Parker
*Assistant Examiner* — David Chen
(74) *Attorney, Agent, or Firm* — Patterson & Sheridan, LLP

(57) ABSTRACT

The present invention generally relates to a floating gate structure and method of forming the same. The floating gate structure has an upper portion which is wider than a middle portion of the floating gate structure. The upper portion may have a flared, rounded or bulbous shape instead of being pointed or having sharp corners. The reduction in pointed or sharp features of the upper portion reduces the electric field intensity near the upper portion, which decreases current leakage through the interpoly dielectric. The method includes forming a nitride cap on the upper surface of the floating gate structure to assist in shaping the floating gate. The floating gate is then formed using multiple selective oxidation and etching processes.

16 Claims, 3 Drawing Sheets

(56) References Cited

U.S. PATENT DOCUMENTS

| | | |
|---|---|---|
| 2008/0032510 A1* | 2/2008 | Olsen ............ 438/770 |
| 2008/0206976 A1 | 8/2008 | Kitamura et al. |
| 2008/0280431 A1 | 11/2008 | Jung et al. |
| 2008/0308858 A1 | 12/2008 | Sandhu et al. |
| 2009/0029540 A1 | 1/2009 | Aritome |
| 2009/0263962 A1 | 10/2009 | Sandhu et al. |
| 2009/0302367 A1 | 12/2009 | Nagano |
| 2010/0062603 A1* | 3/2010 | Ganguly et al. ............ 438/694 |
| 2010/0081267 A1* | 4/2010 | Purayath et al. ............ 438/594 |
| 2010/0279499 A1 | 11/2010 | Tsai et al. |
| 2010/0297826 A1* | 11/2010 | Yun ............ 438/424 |
| 2010/0317186 A1 | 12/2010 | Swenberg et al. |
| 2011/0049599 A1* | 3/2011 | Taketani ............ 257/302 |
| 2011/0217834 A1 | 9/2011 | Ganguly et al. |
| 2011/0256708 A1 | 10/2011 | Choi et al. |

* cited by examiner

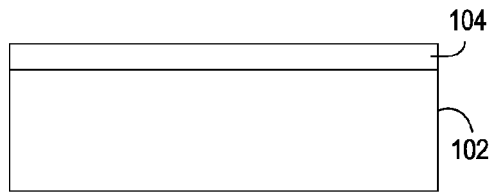
FIG. 1A    FIG. 1B
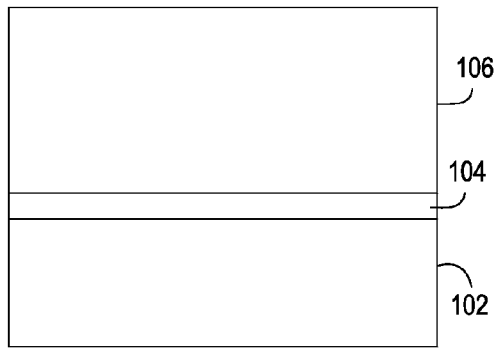
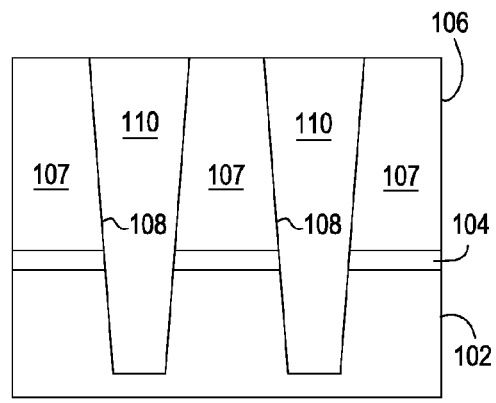
FIG. 1C    FIG. 1D
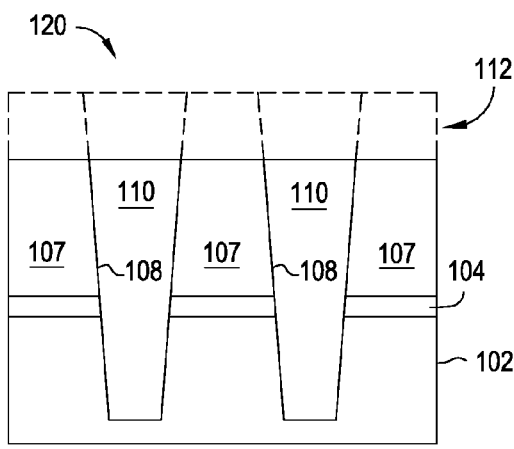
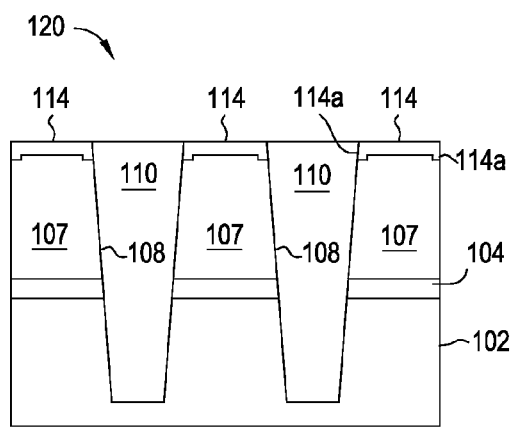
FIG. 1E    FIG. 1F

FLOATING GATES AND METHODS OF FORMATION

CROSS-REFERENCE TO RELATED APPLICATIONS

This application claims benefit of U.S. Provisional Patent Application Ser. No. 61/436,144, filed Jan. 25, 2011, which is herein incorporated by reference.

BACKGROUND OF THE INVENTION

1. Field of the Invention

Embodiments of the present invention generally relate to floating gate structures useful in flash memory.

2. Description of the Related Art

As logic devices continue to scale down according to Moore's Law, processing challenges develop. One such challenge arises in floating gate NAND flash memory chips, which feature transistors that incorporate two gate elements, a control gate and a floating gate, to enable each transistor to assume more than one bit value. Floating gate NAND memory forms the basis of most USB flash memory devices and memory card formats used today.

As NAND memory is scaled down, the geometry of the various components—including the physical space between the floating gates—becomes more challenging for manufacturers. To increase the space between floating gates, it is possible to slim the floating gate structures themselves. However, this approach reduces the top area of the floating gates, which leads to a dominance of sidewall capacitance of an interpoly dielectric (IPD) disposed over the floating gate. Additionally, the slimming process can be inefficient, since it requires multiple oxidation/etching iterations.

Furthermore, when reducing the thickness of the floating gate, it is possible to remove too much material, thereby producing a pointed tip on the upper surface of the floating gate. Consistent with Gauss's Law ($E = Q/2*\pi*\in*r$), which states that electric field intensity is inversely proportional to the radius of curvature, the pointed shape of the slimmed floating gate generates a strong electric field near the pointed tip of the floating gate. The strong electric field near this point results in current leakage through the IPD, which can cause device degradation and/or device failure.

With NAND flash memory increasing in popularity as a convenient storage medium, there is a need for improved manufacturing processes to overcome scaling challenges particular to NAND flash devices.

SUMMARY OF THE INVENTION

The present invention generally relates to a floating gate structure and method of forming the same. The floating gate structure has an upper portion which is wider than a middle portion of the floating gate structure. The upper portion may have a flared, rounded or bulbous shape instead of being pointed or having sharp corners. The reduction in pointed or sharp features of the upper portion reduces the electric field intensity near the upper portion, which decreases current leakage through the IPD. The method includes forming a nitride cap on the upper surface of the floating gate structure to assist in shaping the floating gate. The floating gate is then formed using multiple selective oxidation and etching processes.

In one embodiment, a method of forming a floating gate structure comprises forming a silicon nitride cap on an upper surface of a floating gate. The method further comprises etching one or more field oxides positioned adjacent to the floating gate, and oxidizing a portion of the floating gate to form silicon dioxide. At least a portion of the one or more field oxides and the silicon dioxide of the floating gate are removed.

In another embodiment, a floating gate structure for a flash memory device comprises a bottom portion, an upper portion, and a middle portion disposed therebetween and coupling the bottom portion to the upper portion. The middle portion has a width less than a width of the upper portion and the lower portion.

In another embodiment, a floating gate structure for a flash memory device comprises a bottom portion, an upper portion, and a middle portion disposed therebetween and coupling the bottom portion and the upper portion. The upper portion includes an upper surface which is substantially planar and lateral side portions with rounded edges. The middle portion has a width less than a width of the upper portion and the lower portion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1K are schematic illustrations of a substrate having a floating gate formed thereon.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a floating gate structure and method of forming the same. The floating gate structure has an upper portion which is wider than a middle portion of the floating gate structure. The upper portion may have a flared, rounded or bulbous shape instead of being pointed or having sharp corners. The reduction in pointed or sharp features of the upper portion reduces the electric field intensity near the upper portion, which decreases current leakage through the IPD. The method includes forming a nitride cap on the upper surface of the floating gate structure to assist in shaping the floating gate. The floating gate is then formed using multiple selective oxidation and etching processes.

Selective etching and formation processes described herein may be performed within a SiCoNi™ chamber available from Applied Materials, Inc. of Santa Clara, Calif. It is contemplated that other chambers, including those produced by other manufacturers, may also benefit from embodiments described herein.

Figure 1G:
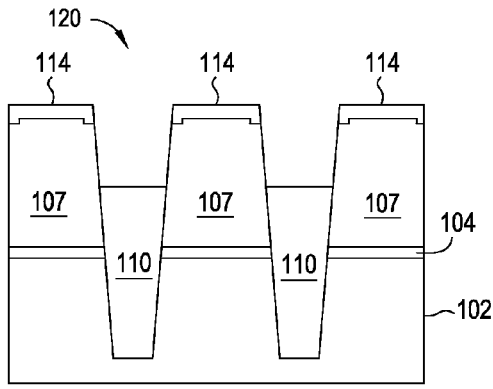

FIGS. 1A-1K are schematic illustrations of a substrate having a floating gate formed thereon. In FIG. 1A, a substrate 102 is shown. The substrate 102 is monocrystalline silicon; however, it is contemplated that other types of substrates may also be used, such as polysilicon. In FIG. 1B, a tunnel oxide layer 104 is shown disposed on the upper surface of the substrate 102. The tunnel oxide layer 104 is silicon dioxide, and is positioned to electrically isolate the substrate 102 from the subsequently formed floating gates. The tunnel oxide layer 104 is formed on the upper surface of the substrate 102 during a thermal oxidation process. Although the tunnel oxide layer 104 is shown as a single layer, it is contemplated that the tunnel oxide layer 104 may include multiple layers, for example, a first silicon oxide layer, a silicon nitride layer, and a second silicon oxide layer. The silicon nitride and the silicon oxide layers may be formed during selective nitridation or oxidation processes, respectively, or by chemical vapor deposition or atomic layer deposition. The first silicon oxide layer, the silicon nitride layer, and the second silicon oxide layer are generally deposited to a thickness about equal to the thickness of the single silicon dioxide layer.

FIG. 1C illustrates a polysilicon layer 106 positioned on the upper surface of the tunnel oxide layer 104. The polysilicon layer 106 can be deposited by chemical vapor deposition or atomic layer deposition. In FIG. 1D, trenches 108 are formed within the polysilicon layer 106, the tunnel oxide 104, and the substrate 102 to define the floating gates 107. The trenches 108 are generally formed using a conventional mask and etch process. After the trenches 108 have been formed, an oxide, such as silicon dioxide, is deposited within the trenches 108 to form field oxides 110. The field oxides 110 may be deposited by atomic layer deposition or chemical vapor deposition. FIG. 1E illustrates the removal of portion 112 from the upper surface of the device 120. The portion 112 is removed during a chemical mechanical polishing process to ensure a planar and uniform upper surface on the device 120.

FIG. 1F illustrates the device 120 subsequent to a selective nitridation process. The selective nitridation process forms a silicon nitride cap 114 on the top surfaces of the floating gates 107. The nitridation process is preferential to polysilicon as compared to silicon dioxide, thus, silicon oxynitride is not formed on the upper surface of the field oxides 110. The silicon nitride cap 114 is used to protect and enable shaping of the upper surfaces of the floating gates 107 during a subsequent oxidation process. The nitride cap 114 also includes lateral side portions 114a, which are formed due at least partly to the diffusion of nitrogen radicals along the interface of the field oxides 110 and the floating gates 107. In addition to the diffusion of nitrogen radicals along the interface, the lateral side portions 114a may also be formed due to dishing during chemical mechanical polishing of portion 112. The silicon dioxide which forms the field oxides 110 is relatively softer than the polysilicon which forms the floating gates 107; thus, the field oxides 110 are removed at slightly greater rate than the floating gates 107. This may result in the upper surface of the field oxides 110 being slightly below the upper surface of the floating gates 107 subsequent to the chemical mechanical polishing step. Therefore, the lateral edges of the floating gates 107 are partially exposed near the top surface of the floating gates 107 after polishing, which may allow for nitridation and formation of the lateral side portions 114a. Alternatively, it is contemplated that the nitride cap 114 may not include the lateral side portions 114a, and thus, would have a uniform thickness across the top surface of the floating gates 107.

The selective plasma nitridation process includes forming nitrogen containing radicals (in situ or remotely) and exposing the floating gates 107 and field oxides 110 to the nitrogen containing radicals. The nitrogen containing radicals react preferentially with silicon due to lower Si—Si bond energies (326 kJ/mol versus 799 kJ/mol for Si—O bonds) to selectively form Si—N bonds.

The nitridation process is performed at a substrate temperature between about 300° C. and about 1200° C., which may be increased as the nitridation proceeds to combat surface saturation. Alternatively, multi-step nitridation processes may be performed, with a first step, for example, performed at a low temperature of about 400° C. to form a first nitride region and a second step performed at a higher temperature of about 800° C. or higher to form a second nitride region that may encompass the first nitride region, or may lie below the first nitride region. Heating may be performed using lamp heating, laser heating, use of a heated substrate support, or by plasma heating.

Nitridation may be performed by thermal means alone, by plasma means alone, or by a combination of the two. Selective thermal nitridation may be performed using ammonia ($NH_3$) as the nitrogen containing species. Radical nitridation may be performed using any relatively low molecular weight nitrogen containing species. Suitable precursors for radical nitridation include, but are not limited to, nitrogen ($N_2$), ammonia ($NH_3$), hydrazine ($N_2H_4$), lower substituted hydrazines ($N_2R_2$, wherein each R is independently hydrogen, a methyl, ethyl, propyl, vinyl, or propenyl group), and lower amines ($NR_aH_b$, wherein a and b are each integers from 0 to 3 and a+b=3, and each R is independently hydrogen, a methyl, ethyl, propyl, vinyl, or propenyl group), amides (RCONR'R", wherein R, R', and R" are each independently hydrogen, a methyl, ethyl, propyl, vinyl, or propenyl group), imines (RR'C=NR", wherein R, R', and R" are each independently hydrogen, a methyl, ethyl, propyl, vinyl, or propenyl group), or imides (RCONR'COR", wherein R, R', and R" are each independently hydrogen, a methyl, ethyl, propyl, vinyl, or propenyl group).

Subsequent to the formation of the nitride cap 114, the field oxides 110 are selectively etched. FIG. 1G illustrates the device 120 having a recessed oxide 110. The field oxides 110 are selectively etched as compared to the polysilicon of the floating gates 107 at a ratio of about 100:1. The oxide is selectively etched by exposing the device 120 to an ionized gas mixture containing $NF_3$, $NH_3$, and $H_2$. The ionized species then react to form $NH_4F$ and $NH_4HF_2$. The $NH_4HF_2$ dissociates into $NH_4^+$ and $HF_2^-$. The $HF_2^-$ produced by the dissociation then protonates the free electron pair of oxygen found in the field oxides 110 to form a film of ammonium hexafluorosilicate. The polysilicon of the floating gates 107 does not have a free electron pair, thus accounting for the relatively greater etching rate of the silicon dioxide as compared to the polysilicon of the floating gates 107. Once the ammonium hexafluorosilicate film has been formed, the film can then be thermally decomposed into volatile products and exhausted from the chamber.

The field oxides 110 are etched for a sufficient time such that the upper surface of the field oxides 110 are at a location between about 20 percent and about 80 percent of the height of the floating gate 107. For example, the top surface of the field oxides 110 may be at a position between about 40 percent and about 60 percent of the height of the floating gates 107. The amount of the oxide which is etched is dependent upon the amount of oxide which is protonated during the ammonium hexafluorosilicate film formation. Thus, longer exposure times, and increases in the concentration of $HF_2^-$ will increase the amount of oxide removal. Additionally, as will become apparent to one skilled in the art, the final shape of the floating gate 107 is affected by the amount of removal of the field oxides 110. Therefore, it is contemplated more or less of the field oxides 110 can be removed to affect the shape of the floating gate 107 as desired.

Figure 1H:
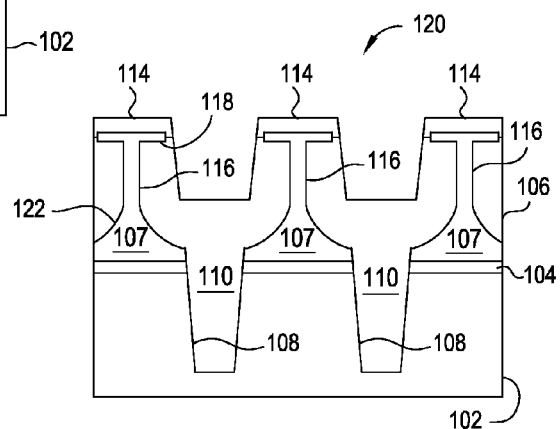

After selectively etching the field oxides 110, exposed portions of the floating gate 107 are oxidized. FIG. 1H illustrates the device 120 having partially oxidized floating gates 107. The exposed portions of the floating gates 107 are oxidized to form silicon dioxide, which is the same material from which the field oxides 110 are formed. Thus, oxide is present in the trenches 108 as well as on the outer surfaces of the floating gates 107.

The floating gates 107 are thermally oxidized in an oxygen-containing environment at a temperature of about 800 degrees Celsius or greater. The thermal oxidation process preferentially oxidizes the polysilicon of the floating gates 107 as compared to the silicon nitride of the caps 114. Therefore, only the polysilicon of the floating gates is oxidized into silicon dioxide; the silicon nitride is not oxidized or is oxidized at a negligible rate. The amount of oxidation of the floating gates 107 depends upon the temperature during the thermal oxidation process, the amount of oxygen provided, and the length of time of exposure. Desirably, about 50 percent or more of the total thickness of each of the floating gates 107 is oxidized during the thermal oxidation process.

The oxygen introduced to the processing environment diffuses into the exposed silicon surfaces at approximately equal rates. Thus, oxygen diffuses into each side of the floating gates 107 to reduce the thickness of the polysilicon by forming silicon dioxide on the outer edges of the floating gates 107. However, the upper portions 118 of the floating gates 107 are covered by the silicon nitride caps 114, which prevents of oxidation of the covered polysilicon. This results in the upper portions 118 of the floating gates 107 having a greater width than the middle portions 116 of the floating gates 107, which are not protected by the silicon nitride caps 114. Similarly, the oxide layer present in the trenches 108 partially covers the lower portions 122 of the floating gates 107, thereby reducing oxidation of the lower portions 122 of the floating gates 107. The lower portions 122 have sloping or curved surfaces due to the distance oxygen diffuses through the floating gates 107 and/or the reduced diffusion through the field oxide 110. Thus, the lower portions 122 of the floating gates 107 will also have a greater width than the middle portions 116 of the floating gates 107. Furthermore, the lower portions 122 of the floating gates 107 will generally have a greater width than the upper portions 118 due to the shape and taper of the trenches 108. However, it is contemplated that the upper portions 118 of the floating gates 107 may have a width greater than or about equal to the width of the lower portions 122.

Figure 1I:
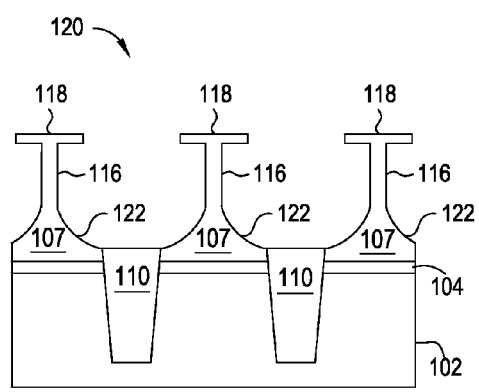

After oxidation of the floating gates 107, the oxidized portions of the floating gates 107 are removed, as are the silicon nitride caps. FIG. 1I illustrates the device 120 having the field oxides 110 etched and silicon nitride caps 114 removed. Similar to the etching of the field oxides 110 described with reference to FIG. 1G, the field oxides 110 are again etched to expose the shaped floating gates 107. Desirably, the upper surfaces of the field oxides 110 are etched to the base of the slanting or curved surface of the lower portions 122 of the floating gates 107. If the field oxides 110 are etched too much, then etching of the tunnel oxide 104 may occur. Excessive etching of the field oxides 110 results in the lower portions 122 of the floating gates 107 overhanging etched portions of the tunnel oxide, which can reduce device longevity and performance.

The field oxides 110 are etched by forming an ammonium hexafluorosilicate film, and then sublimating the film. The silicon nitride caps 114 can be simultaneously or subsequently removed in the same chamber by adjusting the etching chemistry present within the chamber. As described above, the ionized species with the etching gas react to form $NH_4F$ and $NH_4HF_2$. The $NH_4HF_2$ dissociates and is responsible for the etching of silicon oxide, while the $NH_4F$ dissociates into $NH_4^+$ and $F^-$ and is responsible for the etching of silicon nitride. Thus, it will become apparent to one skilled in the art that that selectivity of the etching gas can be varied by adjusting the concentrations of $NF_3$, $NH_3$, and $H_2$ within the etching gas, thereby changing the concentrations of the reactants in accordance with La Chatelier's Principle. For example, increasing the concentration of $NH_3$ in the feed gas increases the amount of $HF_2^-$ produced, which increases oxide etching. Conversely, reducing the concentration of $NH_3$ and increasing the concentration of $H_2$ in the feed gas results in a greater concentration of the fluoride ion, which results in greater silicon nitride etching.

Alternatively, the chemistry of the etching gas can be adjusted such that only the silicon oxide is etched, and the silicon nitride caps 114 remain on the floating gates 107 and are incorporated into the final device. The presence of the silicon nitride cap may assist the final device in resisting breakdown due to high electric fields. Furthermore, an additional oxidation of polysilicon and selective etching of silicon dioxide may be performed to smooth the surfaces of the floating gates 107, and to reduce any sharp peaks or corners which may be present. After the field oxides 110 have been etched, an IPD 130 and control gate 136 may then be deposited over the floating gates 107.

Figure 1J:
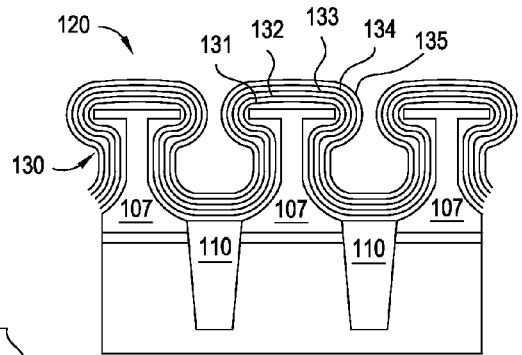

FIG. 1J illustrates the device 120 having an IPD 130 formed thereon. The IPD 130 includes a first nitride layer 131, a first oxide layer 132, a second nitride layer 133, a second oxide layer 134, and a third nitride layer 135. The first nitride layer 131 may be deposited on the floating gates 107 by chemical vapor deposition, atomic layer deposition, plasma-enhanced chemical vapor deposition, plasma-enhanced atomic layer deposition, or formed by selective nitridation. The first oxide layer 132 is then deposited on the first nitride layer 131, and the second nitride layer 133 is then deposited over the first oxide layer 132. A second oxide layer 134 is deposited on the second nitride layer 133, and a third nitride layer 135 is then deposited on the second oxide layer 134. The first and second oxide layers 132, 134 and the second and third nitride layers 133, 135 can be deposited by chemical vapor deposition or atomic layer deposition, either of which may be plasma-enhanced. The first nitride layer 131, the first oxide layer 132, the second nitride layer 133, the second oxide layer 134, and the third nitride layer 135 are generally oxides or nitrides of the same material from which the floating gates 107 are formed (e.g., silicon dioxide and silicon nitride).

Figure 1K:
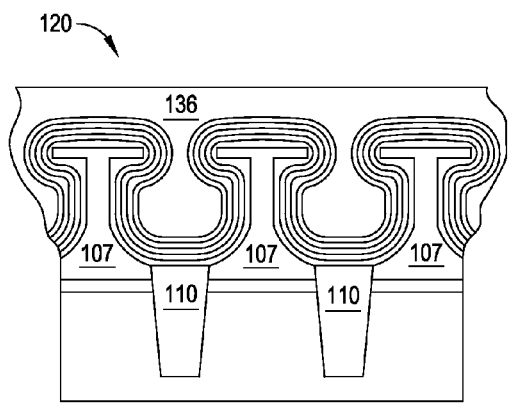

Subsequent to formation of the IPD 130, a control gate 136 is deposited over the IPD 130. FIG. 1K illustrates device 120 having a control gate 136 formed thereon. The control gate 136 is generally formed from the same materials as the floating gate (e.g., polysilicon), and may be deposited by atomic layer deposition or chemical vapor deposition.

Although FIGS. 1H-1K are illustrated as having an "I"-shaped floating gate, it is to be understood that actual processing will likely produce a floating gate having more rounded features as a result of the process conditions and diffusion rates through various materials. The floating gates of FIGS. 1H-1K are simplified for explanation purposes.

Figure 2:
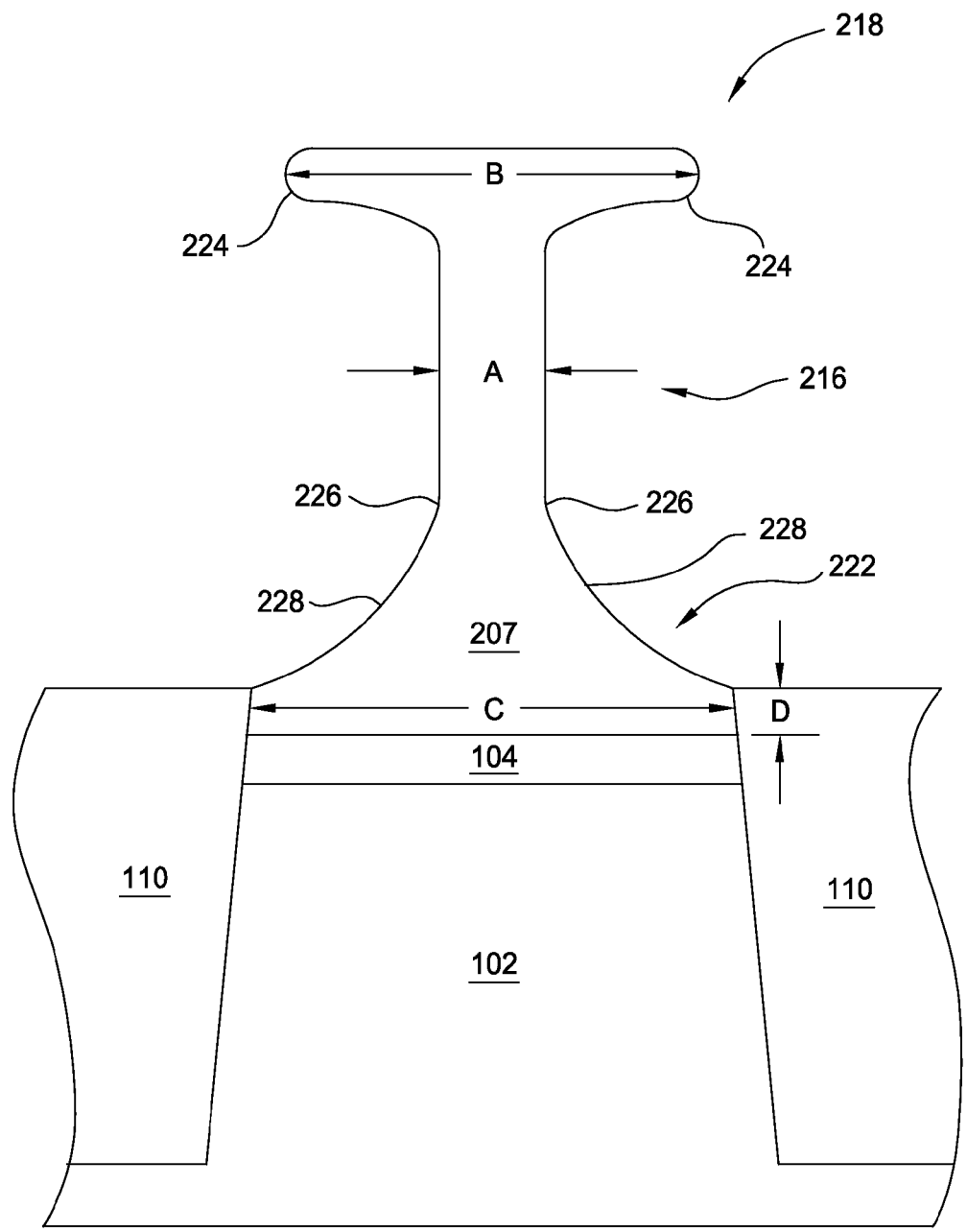
FIG. 2 is a schematic illustration of a floating gate.

FIG. 2 is a schematic illustration of a floating gate 207. The floating gate 207 is disposed over a substrate 102 and a tunnel oxide 104. Field oxides 110 are positioned adjacent to the tunnel oxide 104. The floating gate 207 is similar the floating gate 107, except floating gate 207 is shown has having rounded edges, which is a more likely to occur in actual production than the linear edges of the floating gate 107.

The floating gate 207 has a lower portion 222 disposed on the tunnel oxide 104, an upper portion 218, and a middle portion 216 disposed therebetween. The middle portion 216 has a width A which is about 10 nanometers or less. Prior to reducing the width of the floating gate 207, the floating gate 207 has a thickness of about 20 nanometers. The upper portion 218 has a width B slightly less than about 20 nanometers, such as about 17-20 nanometers, while the lower portion has a width C of about 20-23 nanometers. However, it should be apparent that the widths B and C are dependent upon the taper of the trenches which define the floating gate 207; thus, it is contemplated that widths B and C may be equal. Additionally, it should be apparent that the middle portion 216 may also have a tapering width depending on the taper of the trenches. The total height of the floating gate 207 is within a range from about 50 nanometers to about 100 nanometers. The height D of the field oxide 110 disposed above tunnel oxide 104 is within a range from about 10 nanometers to about 20 nanometers.

The upper portion 218 of the floating gate 207 is generally flared with rounded lateral edges 224 due to the formation and removal of a silicon nitride cap. However, it is to be understood that the shape of the upper portion of the floating gate 207 is a function of the size of the silicon nitride cap as well as the amount of oxidation and removal of material from the floating gate 207. Thus, it is contemplated that the upper portion 218 may be formed into other shapes, including bulbous or rounded shapes. However, it is desirable that the upper portion does not include sharp or pointed edges.

The middle portion 216 of the floating gate 207 has an approximately uniform width A, due to uniform diffusion rate of the oxygen into the floating gate 207 during oxidation of the floating gate 207. Alternatively, the middle portion 216 may have a slightly tapering width with edges parallel to the edges of the floating gate 207 prior to oxidation of the floating gate 207. At location 226, the middle portion 216 transitions into the lower portion 222. The point 226 corresponds to the height of the field oxide 110 after the ammonium hexafluorosilicate film formation and removal (as shown in FIG. 1G). The lower portion 222 has an upper rounded edge 228 caused by the limited diffusion of oxygen through the floating gate 207 and/or the field oxide 110 during oxidation of the floating gate 207. The rounded edge 228 is shown as transitioning into the top surface of the field oxide 110, however, it is contemplated that the top surface of the field oxide 110 may be at a height greater than or less than that of the lower part of the rounded edge 228.

Benefits of the present invention include floating gate structures which do not have pointed upper portions. The floating gate structures of the present invention have flat, bulbous, or round upper portions which reduce the electric field intensity near the upper portion of the floating gate and an IPD deposited thereon. Since the electric field is reduced, current leakage through the IPD is also reduced, thus improving device performance and longevity. Additionally, floating gate formation methods disclosed herein are able to shape the floating gate structures with relatively fewer oxidation/etching iterations.

While the foregoing is directed to embodiments of the present invention, other and further embodiments of the invention may be devised without departing from the basic scope thereof, and the scope thereof is determined by the claims that follow.

We claim:

1. A method of forming a floating gate structure, comprising:
   exposing an upper surface of a floating gate to nitrogen radicals to form a first silicon nitride region thereon;
   exposing the upper surface of the floating gate to the nitrogen radicals at a temperature of about 800° C. or higher to form a second silicon nitride region thereon, wherein the second silicon nitride region encompasses the first silicon nitride region;
   after forming the first and second silicon nitride regions, removing one or more field oxides positioned adjacent to the floating gate;
   oxidizing a portion of the floating gate to form silicon dioxide;
   further removing a portion of the one or more field oxides and the silicon dioxide of the floating gate; and
   entirely removing the first and second silicon nitride regions from the upper surface of the floating gate.

2. The method of claim 1, wherein the removing one or more field oxides comprises forming a film of ammonium hexafluorosilicate and sublimating the film.

3. The method of claim 1, wherein the oxidizing a portion of the floating gate comprises thermally oxidizing the floating gate in an oxygen-containing environment.

4. The method of claim 1, wherein the further removing comprises forming a film of ammonium hexafluorosilicate and sublimating the film.

5. The method of claim 1, wherein removing one or more field oxides positioned adjacent to the floating gate comprises exposing portions of the floating gate.

6. The method of claim 1, wherein oxidizing a portion of the floating gate to form silicon dioxide comprises diffusing oxygen into side regions of the floating gate.

7. The method of claim 1, further comprising conformally depositing a dielectric material over the floating gate after the entirely removing the first and second silicon nitride regions.

8. The method of claim 1, further comprises exposing the one or more field oxides to the nitrogen radicals.

9. The method of claim 7, wherein the dielectric material is a multi-layer stack comprising at least a first nitride layer, a first oxide layer, a second nitride layer, a second oxide layer, and a third nitride layer.

10. A method of forming a floating gate structure, comprising:
   depositing an oxide within trenches formed in a polysilicon layer disposed over a substrate;
   performing a polishing process to expose a planar upper surface of the oxide and a planar upper surface of the polysilicon layer;
   selectively forming a first silicon nitride region on the planar upper surface of the polysilicon layer by exposing the planar upper surface of the polysilicon layer only to nitrogen radicals at a temperature of about 400° C.;
   selectively forming a second silicon nitride region on the planar upper surface of the polysilicon layer by exposing the planar upper surface of the polysilicon layer to the nitrogen radicals at a temperature of about 800° C. or higher, wherein the second silicon nitride region encompasses the first silicon nitride region;
   after forming the first and second silicon nitride regions, etching an upper portion of the oxide deposited within the trenches;
   oxidizing an exposed surface of the polysilicon layer;
   further etching a portion of the oxide deposited within the trenches and the oxidized exposed surface of the polysilicon layer; and entirely removing the first and second silicon nitride regions from the planar upper surface of the polysilicon layer.

11. The method of claim 10, further comprising conformally depositing a dielectric material over the polysilicon layer after the entirely removing the first and second silicon nitride regions.

12. The method of claim 1, wherein the first silicon nitride region is formed at a temperature of about 400° C.

13. A method of forming a floating gate structure, comprising:
   forming a first nitride region on a surface of a floating gate by a nitridation process;
   forming a second nitride region on the surface of the floating gate by the nitridation process at a temperature of about 800° C. or higher, wherein the second nitride region encompasses the first nitride region;
   after forming the first and second nitride regions, etching one or more field oxides positioned adjacent to the floating gate;
   oxidizing a portion of the floating gate to form an oxidized region;
   a portion of the one or more field oxides and the oxidized region of the floating gate; and
   entirely removing the and second nitride regions from the surface of the floating gate.

14. The method of claim 13, wherein oxidizing a portion of the floating gate to form an oxidized region comprises diffusing oxygen into side walls of the floating gate.

15. The method of claim 14, wherein the first nitride region is formed at a temperature of about 400° C.

16. The method of claim 15, wherein the nitridation process is performed using a lamp heating, a laser heating, a heated substrate support, or a plasma heating.

* * * * *

UNITED STATES PATENT AND TRADEMARK OFFICE
CERTIFICATE OF CORRECTION

PATENT NO.       : 9,054,038 B2
APPLICATION NO.  : 13/193573
DATED            : June 9, 2015
INVENTOR(S)      : Rogers et al.

Page 1 of 1

It is certified that error appears in the above-identified patent and that said Letters Patent is hereby corrected as shown below:

In the Claims:

Column 8, Claim 5, Line 29, please insert --the-- after removing;

Column 8, Claim 10, Line 53, please delete "only";

Column 10, Claim 13, Line 6, please insert --further etching-- before a;

Column 10, Claim 13, Line 8, please insert --first-- before and.

Signed and Sealed this
First Day of December, 2015

Michelle K. Lee
*Director of the United States Patent and Trademark Office*